United States Patent
Xin et al.

(10) Patent No.: US 9,391,100 B2
(45) Date of Patent: Jul. 12, 2016

(54) DISPLAY SUBSTRATE AND FABRICATING METHOD THEREOF, MASK PLATE, AND MASK PLATE GROUP

(71) Applicants: BOE TECHNOLOGY GROUP CO., LTD., Beijing (CN); CHENGDU BOE OPTOELECTRONICS TECHNOLOGY CO., LTD., Chengdu, Sichuan Province (CN)

(72) Inventors: Yanxia Xin, Beijing (CN); Seungyik Park, Beijing (CN); Tianlei Shi, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

( * ) Notice: Subject to any disclaimer, the term of this patent is extended or adjusted under 35 U.S.C. 154(b) by 0 days.

(21) Appl. No.: 14/522,528

(22) Filed: Oct. 23, 2014

(65) Prior Publication Data
US 2015/0318316 A1 Nov. 5, 2015

(30) Foreign Application Priority Data
May 4, 2014 (CN) .......................... 2014 1 0184478

(51) Int. Cl.
*H01L 27/01* (2006.01)
*H01L 27/12* (2006.01)
*H01L 31/0392* (2006.01)
*B05B 15/04* (2006.01)

(52) U.S. Cl.
CPC .......... *H01L 27/1288* (2013.01); *B05B 15/045* (2013.01); *H01L 27/1214* (2013.01)

(58) Field of Classification Search
CPC ............ H01L 27/1288; H01L 27/1214; B05B 15/045

USPC .......................................................... 257/347
See application file for complete search history.

(56) References Cited

U.S. PATENT DOCUMENTS

2014/0022498 A1* 1/2014 Kim .................. G02F 1/134309
                                                            349/106
2015/0041777 A1* 2/2015 Chung ................ H01L 51/5271
                                                            257/40

(Continued)

FOREIGN PATENT DOCUMENTS

| CN | 101354511 | 1/2009 |
| CN | 102289114 | 12/2011 |
| JP | H09325362 | 12/1997 |

OTHER PUBLICATIONS

Chinese Office Action with English Language Translation, dated Mar. 22, 2016, Chinese Application No. 201410184478.4.

*Primary Examiner* — David S Blum
(74) *Attorney, Agent, or Firm* — Blakely Sokoloff Taylor & Zafman LLP

(57) ABSTRACT

The present disclosure provides a display substrate and a mask plate, the display substrate comprising a plurality of sub display substrates, each of the sub display substrates comprising a plurality of pixel units, each pixel unit comprising a pixel electrode, a common electrode and a source-drain channel, wherein, from the center of the display substrate to the edge of the display substrate, the plurality of sub display substrates are arranged from large to small according to the overlapping area of the pixel electrode and the common electrode and/or the plurality of sub display substrates are arranged from small to large according to the width to length ratio of the source-drain channel of the sub display substrate. The present disclosure can avoid electrical badness of the sub display substrates located at the edges.

3 Claims, 6 Drawing Sheets

(56) References Cited

U.S. PATENT DOCUMENTS

2015/0154932 A1* 6/2015 Lee .................. G09G 3/3655 345/206

2015/0185567 A1* 7/2015 Lee .................. H01L 27/1248 349/44

2015/0313021 A1* 10/2015 Yang .................. H01L 21/77 361/748

* cited by examiner

DISPLAY SUBSTRATE AND FABRICATING METHOD THEREOF, MASK PLATE, AND MASK PLATE GROUP

FIELD OF THE DISCLOSURE

The present disclosure relates to the display field, particularly to a display substrate and a fabricating method thereof, a mask plate, and a mask plate group.

BACKGROUND OF THE DISCLOSURE

The thin film transistor-liquid crystal display (TFT-LCD) is the current main stream flat panel display, its basic structure comprises a liquid crystal screen formed by box aligning of two substrates. An electric field is applied to the liquid crystal between two substrates through the pixel electrode and the common electrode on the substrate, so as to control rotation of the liquid crystal to form the desired image, and enable the voltage to be kept until update of the image next time through the storage capacitor.

In the production process of the liquid crystal screen, firstly, it is required to form various thin film pattern with a fixed size on an entire piece of substrate through patterning process, including pattern of the pixel electrode, pattern of the source drain, pattern of the insulating layer etc., thereby forming a display substrate of a large size, then the display substrate is cut to obtain sub display substrates of various sizes, thereby forming a liquid crystal screen of the desired size. Wherein the larger the size of the display substrate is, the more the number of the sub display substrates obtained from cutting is, the higher the utilization rate and the benefit are, and the lower the manufacture cost of the liquid crystal screen is. However, the existing thin film pattern obtained through deposition technique (PECVD) have edge effect on the display substrate, i.e., the edge of the insulating layer (SiNx film) in the display substrate is thin and the middle thereof is thick, while the edge of the semiconductor layer (non-doped a-Si film) is thick and the middle thereof is thin, such that sub display substrates located at different positions of the display substrate have electrical difference, particularly for sub display substrates located at the edge of the display substrate, the off-state current and the threshold voltage of the thin film transistor thereon are increased, and the on-state current thereof is decreased, thereby causing electrical badness of the sub display substrates located at the edge of the display panel.

SUMMARY OF THE DISCLOSURE (I) Technical Problem to be Solved

The technical problem to be solved by the present disclosure is to provide a display substrate and a fabricating method thereof, a mask plate, and a mask plate group, which can reduce electrical difference between sub display substrates at different positions on the display substrate.

(II) Technical Solution

In order to solve the above technical problem, the technical solution of the present disclosure provides a display substrate comprising a plurality of sub display substrates, each of the sub display substrates comprising a plurality of pixel units, each pixel unit comprising a pixel electrode, a common electrode and a source-drain channel, wherein, from the center of the display substrate to the edge of the display substrate, the plurality of sub display substrates are arranged from large to small according to the overlapping area of the pixel electrode and the common electrode, and/or the plurality of sub display substrates are arranged from small to large according to the width to length ratio of the source-drain channel of the sub display substrate.

Further, as for each of the sub display substrates, a plurality of pixel units therein have the same structure.

Further, the plurality of sub display substrate are arranged in a matrix.

In order to solve the above problem, the present disclosure further provides a mask plate for fabricating the above display substrate, wherein the mask plate is used for fabricating a pixel electrode, the mask plate comprises a plurality of mask units, the plurality of mask units are in one-to-one correspondence with a plurality of sub display substrates on the display substrate, from the center of the mask plate to the edge of the mask plate, the plurality of mask units are arranged from large to small according to the area for forming the pixel electrode.

Further, the plurality of mask units are arranged in a matrix.

In order to solve the above technical problem, the present disclosure further provides a mask plate for fabricating the above display substrate, wherein the mask plate is used for fabricating a common electrode, the mask plate comprises a plurality of mask units, the plurality of mask units are in one-to-one correspondence with a plurality of sub display substrates on the display substrate, from the center of the mask plate to the edge of the mask plate, the plurality of mask units are arranged from large to small according to the area for forming the common electrode.

Further, the plurality of mask units are arranged in a matrix.

In order to solve the above technical problem, the present disclosure further provides a mask plate for fabricating the above display substrate, wherein the mask plate is used for fabricating a source-drain channel, the mask plate comprises a plurality of mask units, the plurality of mask units are in one-to-one correspondence with a plurality of sub display substrates on the display substrate, from the center of the mask plate to the edge of the mask plate, the plurality of mask units are arranged from small to large according to the width to length ratio for forming the source-drain channel.

Further, the plurality of mask units are arranged in a matrix.

In order to solve the above technical problem, the present disclosure further provides a mask plate comprising at least one of a mask plate which is used for fabricating a pixel electrode, a common electrode, or a source-drain channel.

In order to solve the above technical problem, the present disclosure further provides a method for fabricating a display substrate, comprising: forming a plurality of sub display substrates on a substrate, each of the sub display substrates comprising a plurality pixel units, each pixel unit comprising a pixel electrode, a common electrode and a source-drain channel, from the center of the display substrate to the edge of the display substrate, the plurality of sub display substrates are arranged from large to small according to the overlapping area of the pixel electrode and the common electrode, and/or the plurality of sub display substrates are arranged from small to large according to the width to length ratio of the source-drain channel of the sub display substrate.

(III) Beneficial Effect

The display substrate provided by the present disclosure comprises a plurality of sub display substrates, wherein, from the center of the display substrate to the edge of the display substrate, the plurality of sub display substrates are arranged from large to small according to the overlapping area of the pixel electrode and the common electrode and/or the plurality of sub display substrates are arranged from small to large according to the width to length ratio of the source-drain channel of the sub display substrate. The present disclosure can reduce electrical difference between sub display substrates at different positions, and avoid electrical badness of the sub display substrates located at the edges caused by a small on-state current, a large threshold voltage and a large off-state current of the edge of the display substrate generated by the coating preparation process.

DETAILED DESCRIPTION OF THE DISCLOSURE

Next, the present disclosure will be described in more detail in combination with the drawings and the embodiments. The following embodiments are used for explaining the present disclosure, but not for limiting the scope of the present disclosure.

The present disclosure provides a display substrate comprising a plurality of sub display substrates, each of the sub display substrates comprising a plurality of pixel units, each pixel unit comprising a pixel electrode, a common electrode and a source-drain channel, wherein, from the center of the display substrate to the edge of the display substrate, the plurality of sub display substrates are arranged from large to small according to the overlapping area of the pixel electrode and the common electrode, and/or the plurality of sub display substrates are arranged from small to large according to the width to length ratio of the source-drain channel of the sub display substrate.

Figure 1:
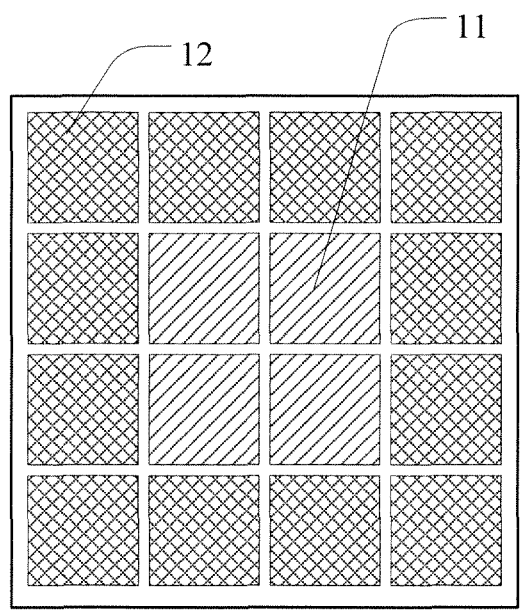
FIG. 1 is a schematic view of a first display substrate provided by the present disclosure.
Figure 2:
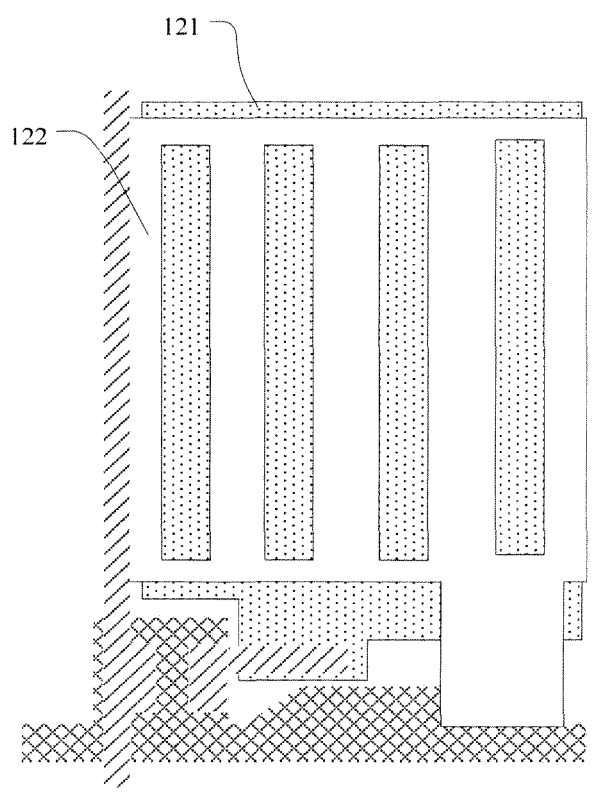
FIG. 2 is a schematic view of a first pixel unit structure provided by the present disclosure.
Figure 3:
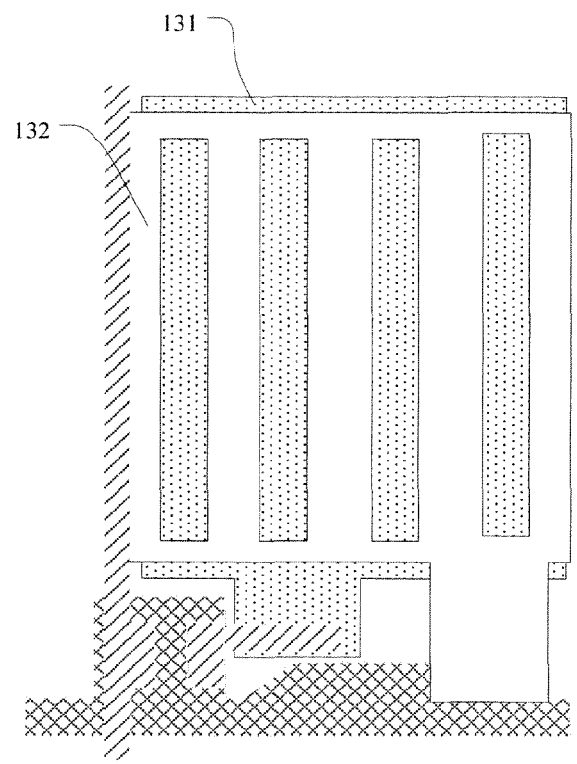
FIG. 3 is a schematic view of a second pixel unit structure provided by the present disclosure.

Referring to FIG. 1, FIG. 1 is a schematic view of a display substrate provided by the present disclosure, comprising a plurality of sub display units, as for each sub display substrate, a plurality of pixel units therein have the same structure, specifically, the display substrate comprises a plurality of sub display substrates 11 and a plurality of sub display substrates 12, wherein the plurality of sub display substrates 11 are distributed close to the center of the display substrate, the plurality of sub display substrates 12 are distributed along the edge of the display substrate, in order to reduce electrical difference between the sub display substrate 11 and the sub display substrate 12, different settings can be made to the overlapping areas of the pixel electrodes and the common electrodes in the pixel units in the sub display substrate 11, and the sub display substrate 12, referring to FIG. 2 and FIG. 3, FIG. 2 is a structural view of a pixel unit in the sub display substrate 11, FIG. 3 is a structural view of a pixel unit in the sub display substrate 12, wherein the overlapping area of the pixel electrode and the common electrode of the pixel unit as shown in FIG. 2 is larger than the overlapping area of the pixel electrode and the common electrode of the pixel unit as shown in FIG. 3.

Figure 4:
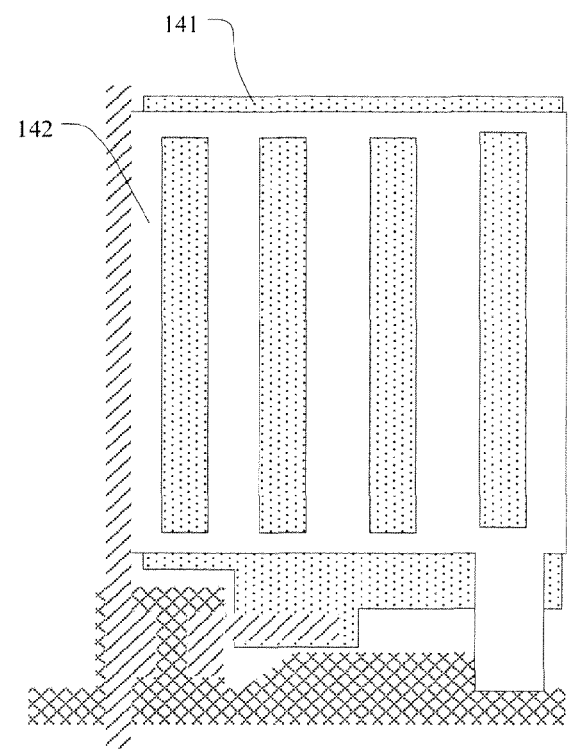
FIG. 4 is a schematic view of a third pixel unit structure provided by the present disclosure.
Figure 5:
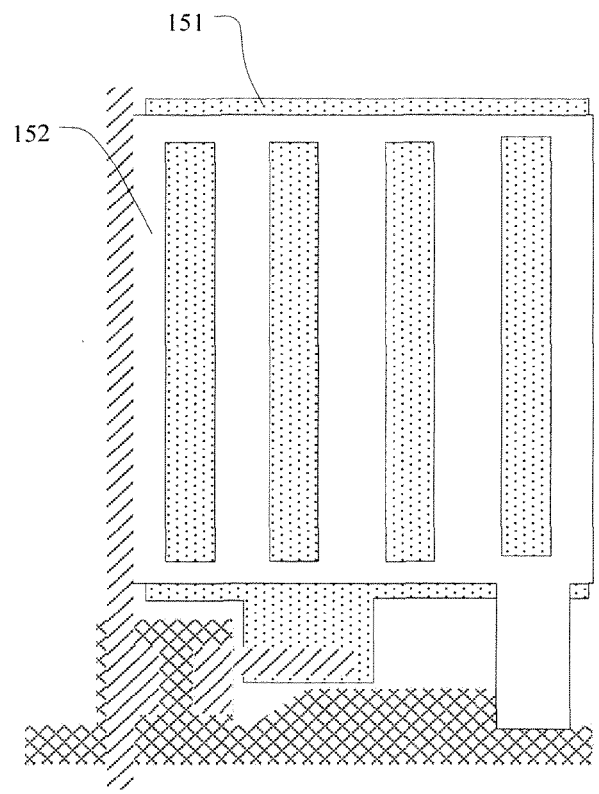
FIG. 5 is a schematic view of a fourth pixel unit structure provided by the present disclosure.

Specifically, different settings of the overlapping areas of the two can be made by reducing the area of the pixel electrode and/or the common electrode, referring to FIG. 2 and FIG. 3, wherein, the area of a common electrode 122 in FIG. 2 is same as the area of a common electrode 132 in FIG. 3, however, the area of a pixel electrode 121 in FIG. 2 is larger than a pixel electrode 131 in FIG. 3, thereby the overlapping area of the pixel electrode and the common electrode of the pixel unit as shown in FIG. 2 is larger than the overlapping area of the pixel electrode and the common electrode of the pixel unit as shown in FIG. 3. In addition, the structure of the pixel unit of the sub display substrate 12 may also be as shown in FIG. 4, i.e., the sub display substrate 11 adopts the pixel unit structure as shown in FIG. 2, the sub display substrate 12 adopts the pixel unit structure as shown in FIG. 4, wherein the area of the pixel electrode 121 in FIG. 2 is same as the area of a pixel electrode 141 in FIG. 4, while the area of the common electrode 122 in FIG. 2 is larger than the area of a common electrode 142 in FIG. 4, thereby the overlapping area of the pixel electrode and the common electrode of the pixel unit as shown in FIG. 2 is larger than the overlapping area of the pixel electrode and the common electrode of the pixel unit as shown in FIG. 4. Preferably, the structure of the pixel unit of the sub display substrate 12 may also be as shown in FIG. 5, i.e., the sub display substrate 11 adopts the pixel unit structure as shown in FIG. 2, the sub display substrate 12 adopts the pixel unit structure as shown in FIG. 5, wherein the area of the pixel electrode 121 in FIG. 2 is same as the area of a pixel electrode 151 in FIG. 5, while the area of the common electrode 122 in FIG. 2 is larger than the area of a common electrode 152 in FIG. 5, thereby the overlapping area of the pixel electrode and the common electrode of the pixel unit as shown in FIG. 2 is larger than the overlapping area of the pixel electrode and the common electrode of the pixel unit as shown in FIG. 5.

Figure 6:
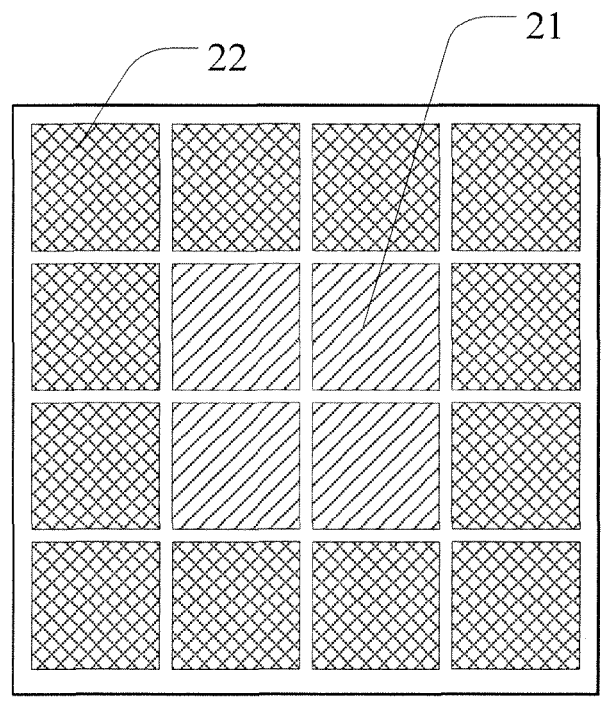
FIG. 6 is a schematic view of a second display substrate provided by the present disclosure.
Figure 7:
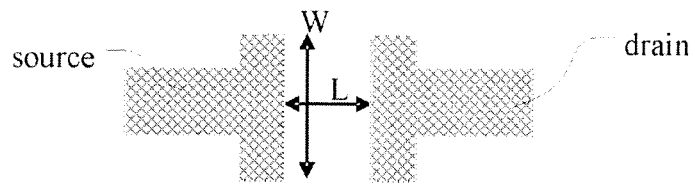
FIG. 7 is a schematic view of a source-drain channel of a pixel unit structure provided by the present disclosure.
Figure 8:
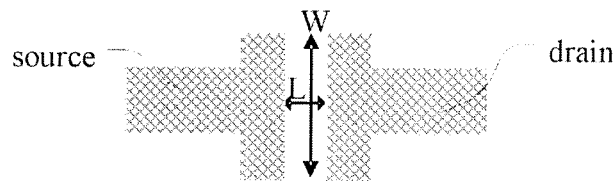
FIG. 8 is a schematic view of a source-drain channel of another pixel unit structure provided by the present disclosure.

Referring to FIG. 6, FIG. 6 is a schematic view of a display substrate provided by the present disclosure, comprising a plurality of sub display substrates 21 and a plurality of sub display substrates 22, wherein the plurality of sub display substrates 21 are distributed close to the center of the display substrate, the plurality of sub display substrates 22 are distributed along the edge of the display substrate, in order to reduce electrical difference between the sub display substrate 21 and the sub display substrate 22, different settings can be made to the width to length ratio (W/L) of the source-drain channels of the pixel units in the sub display substrate 21 and the sub display substrate 22, referring to FIG. 7 and FIG. 8, FIG. 7 is a schematic view of a source-drain channel of a pixel unit in the sub display substrate 21, FIG. 8 is a schematic view of a source-drain channel of a pixel unit in the sub display substrate 22, wherein the width to length ratio of the source-drain channel of the pixel unit as shown in FIG. 7 is smaller than the width to length ratio of the source-drain channel of the pixel unit as shown in FIG. 8.

Figure 9:
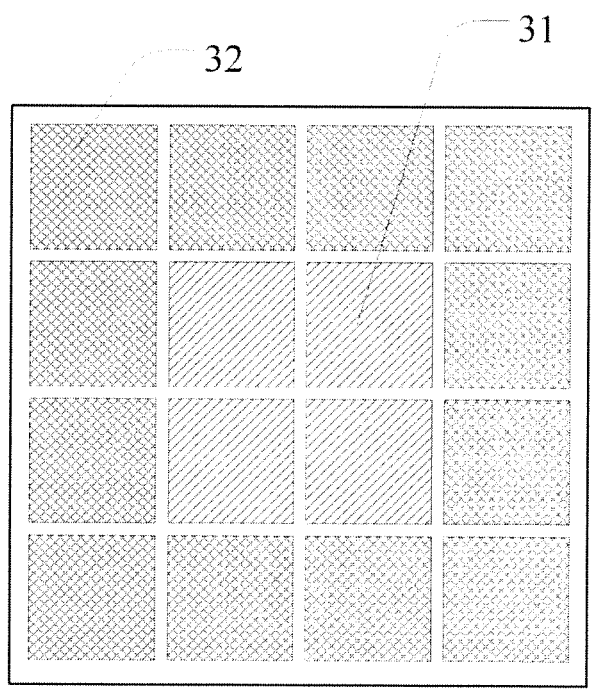
FIG. 9 is a schematic view of a third display substrate provided by the present disclosure.

Referring to FIG. 9, FIG. 9 is a schematic view of a display substrate provided by the present disclosure, comprising a plurality of sub display substrates 31 and a plurality of sub display substrates 32, wherein the plurality of sub display substrates 31 are distributed close to the center of the display substrate, the plurality of sub display substrates 32 are distributed along the edge of the display substrate, in order to reduce electrical difference between the sub display substrate 31 and the sub display substrate 32, the overlapping area of the pixel electrode and the common electrode of the pixel unit in the sub display substrate 31 is larger than the overlapping area of the pixel electrode and the common electrode of the pixel unit in the sub display substrate 32, and the width to length ratio of the source-drain channel of the pixel in the sub display substrate 31 is smaller than the width to length ratio of the source-drain channel of the pixel in the sub display substrate 32.

Figure 10:
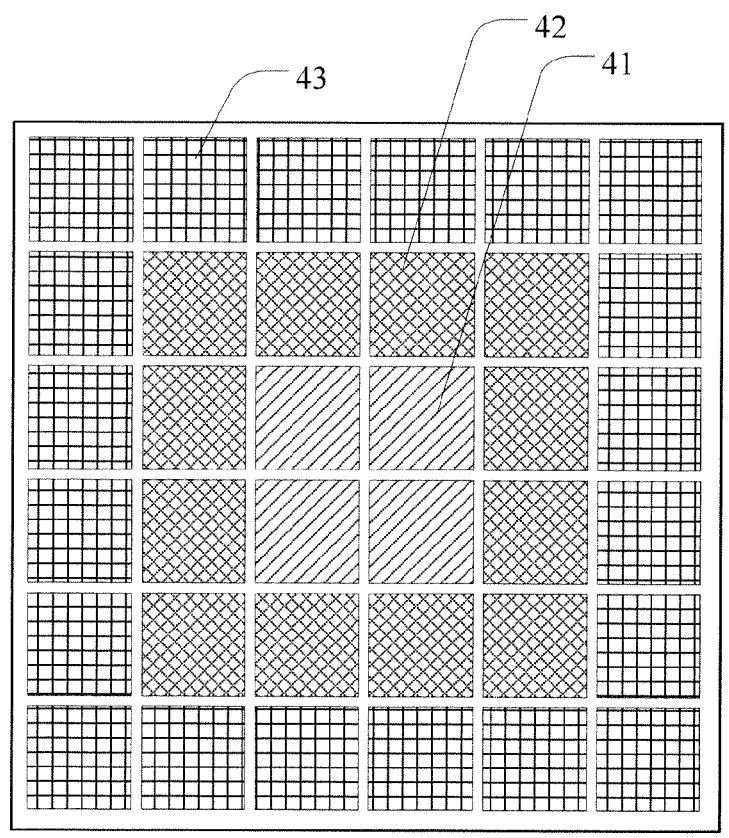
FIG. 10 is a schematic view of a fourth display substrate provided by the present disclosure.

In the present disclosure, the types of the sub display substrates in the display substrate may be the above two, there may also be three types, four types etc., referring to FIG. 10, FIG. 10 is a schematic view of a display substrate provided by the present disclosure, comprising a plurality of sub display substrates 41, a plurality of sub display substrates 42 and a plurality of sub display substrates 43, wherein the sub display substrates 41, the sub display substrates 42 and the sub display substrates 43 are distributed successively along the middle to the edge of the display substrate, in order to reduce electrical difference among the sub display substrate 41, the sub display substrate 42 and the sub display substrate 43, the overlapping areas of the pixel electrodes and the common electrodes of the pixel units in the sub display substrate 41, the sub display substrate 42 and the sub display substrate 43 decrease successively and/or the width to length ratios of the source-drain channels increase successively.

The display substrate provided by the present disclosure comprises a plurality of sub display substrates, wherein, from the center of the display substrate to the edge of the display substrate, the plurality of sub display substrates are arranged from large to small according to the overlapping area of the pixel electrode and the common electrode and/or the plurality of sub display substrates are arranged from small to large according to the width to length ratio of the source-drain channel of the sub display substrate. The present disclosure can reduce electrical difference between sub display substrates at different positions, and avoid electrical badness of the sub display substrates located at the edges caused by a small on-state current, a large threshold voltage and a large off-state current of the edge of the display substrate generated by the coating preparation process.

Figure 11:
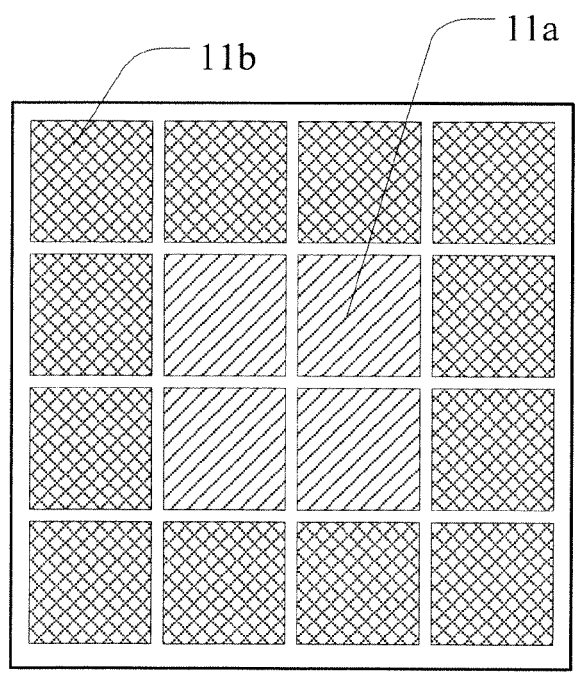
FIG. 11 is a schematic view of a first mask plate provided by the present disclosure.

In addition, the present disclosure further provides a mask plate for fabrication of the above display substrate, specifically, the mask plate is used for fabricating a pixel electrode, the mask plate comprises a plurality of mask units, the plurality of mask units and in one-to-one correspondence with the plurality of sub display substrates on the display substrate, from the center of the mask plate to the edge of the mask plate, the plurality of mask units are arranged from large to small according to the area for forming the pixel electrode. Wherein the plurality of mask units on the mask plate may be arranged in a matrix, referring to FIG. 11, FIG. 11 is a schematic view of a mask plate provided by the present disclosure, comprising a plurality of mask units 11a and a plurality of mask units 11b, the plurality of mask units 11a are distributed close to the center of the mask plate, the plurality of mask units 11b are distributed along the edge of the mask plate, wherein the mask area of the mask unit 11a for forming the pixel electrode is larger than the mask area of the mask unit 11b for forming the pixel electrode. In addition, the types of the mask units in the mask plate may be the above two, there may also be three types, four types etc., as long as the mask areas thereof are arranged from large to small along the center to the edge of the mask plate. In the process of fabricating the above display substrate through the mask, a figure of a pixel electrode is formed on the substrate through the mask plate firstly, then a common electrode is formed on the substrate (the areas of the common electrodes of all the sub display substrates formed on the substrate may be the same), thereby enabling the overlapping areas of the pixel electrodes and the common electrodes of the pixel units in the sub display substrates on the substrate decrease successively from the center to the edge of the substrate.

Figure 12:
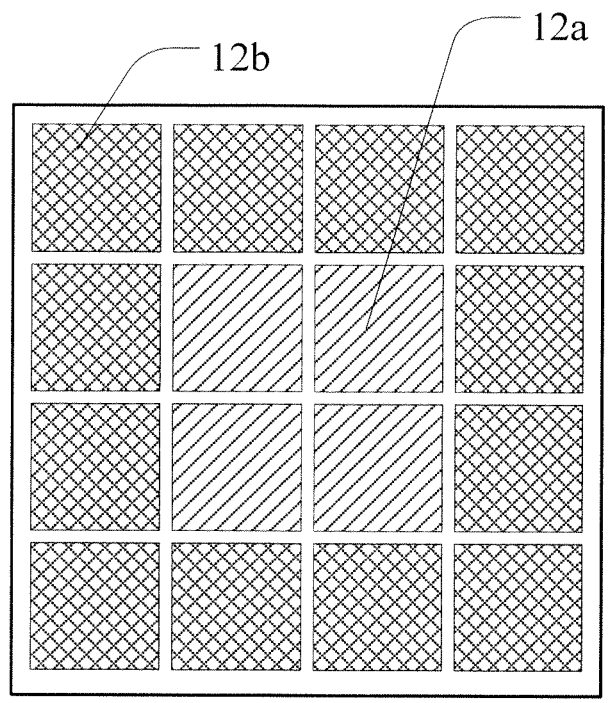
FIG. 12 is a schematic view of a second mask plate provided by the present disclosure.

The present disclosure further provides another mask plate for fabrication of the above display substrate, specifically, the mask plate is used for fabricating a common electrode, the mask plate comprises a plurality of mask units, the plurality of mask units and in one-to-one correspondence with the plurality of sub display substrates on the display substrate, from the center of the mask plate to the edge of the mask plate, the plurality of mask units are arranged from large to small according to the area for forming the common electrode. Wherein the plurality of mask units on the mask plate may be arranged in a matrix, referring to FIG. 12, FIG. 12 is a schematic view of a mask plate provided by the present disclosure, comprising a plurality of mask units 12a and a plurality of mask units 12b, the plurality of mask units 12a are distributed close to the center of the mask plate, the plurality of mask units 12b are distributed along the edge of the mask plate, wherein the mask area of the mask unit 12a for forming the common electrode is larger than the mask area of the mask unit 12b for forming the common electrode. In addition, the types of the mask units in the mask plate may be the above two, there may also be three types, four types etc., as long as the mask areas thereof are arranged from large to small along the center to the edge of the mask plate. In the process of fabricating the above display substrate through the mask, a figure of a pixel electrode is formed on the substrate firstly (the areas of the pixel electrodes of all the sub display substrates formed on the substrate may be the same), then a common electrode is formed on the substrate through the mask plate, thereby enabling the overlapping areas of the pixel electrodes and the common electrodes of the pixel units in the sub display substrates on the substrate decrease successively from the center to the edge of the substrate.

Figure 13:
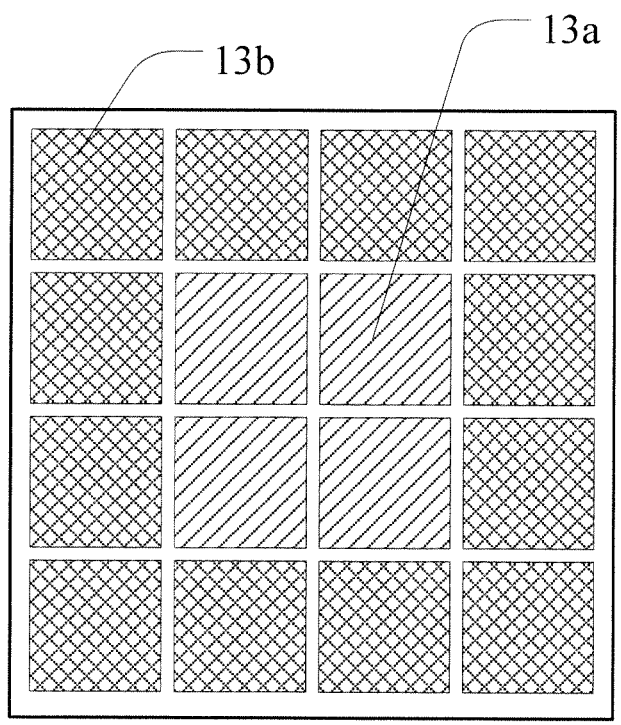
FIG. 13 is a schematic view of a third mask plate provided by the present disclosure.

The present disclosure further provides a mask plate for fabrication of the above display substrate, specifically, the mask plate is used for fabricating a source-drain channel, the mask plate comprises a plurality of mask units, the plurality of mask units and in one-to-one correspondence with the plurality of sub display substrates on the display substrate, from the center of the mask plate to the edge of the mask plate, the plurality of mask units are arranged from small to large according to the width to length ratio for forming the source-drain channel. Wherein the plurality of mask units on the mask plate may be arranged in a matrix, referring to FIG. 13, FIG. 13 is a schematic view of a mask plate provided by the present disclosure, comprising a plurality of mask units 13a and a plurality of mask units 13b, the plurality of mask units 13a are distributed close to the center of the mask plate, the plurality of mask units 13b are distributed along the edge of the mask plate, wherein the width to length ratio of the mask unit 13a for forming the source-drain channel of the pixel is smaller than the width to length ratio of the mask unit 13b for forming the source-drain channel of the pixel. In addition, the types of the mask units in the mask plate may be the above two, there may also be three types, four types etc., as long as the width to length ratios thereof for forming the source-drain channels of the pixels are arranged from small to large along the center to the edge of the mask plate.

In addition, the present disclosure further provides a mask plate group comprising at least one of the above mask plate for fabricating a pixel electrode, the above mask plate for fabricating a common electrode, the above mask plate for fabricating a source-drain channel.

The mask plate group provided by the present disclosure may be any one or more than two mask plates in the pixel electrode, the common electrode, the source drain in the thin film transistor array structure, and each mask plate figure is provided with two or more mask units, and a gradient design of a mask pattern from the middle to the edge is formed, as for a display substrate fabricated through the mask plate group, from the center of the display substrate to the edge of the display substrate, a plurality of sub display substrate thereon can be arranged from large to small according to the overlapping area of the pixel electrode and the common electrode and/or the plurality of sub display substrates can be arranged from small to large according to the width to length ratio of the source-drain channel of the sub display substrate, thereby avoiding electrical badness of the sub display substrates located at the edges caused by a small on-state current, a large threshold voltage and a large off-state current of the edge of the display substrate generated by the coating preparation process.

In addition, the present disclosure further provides a method for fabricating the above display substrate, comprising: forming a plurality of sub display substrates on a substrate, each of the sub display substrates comprising a plurality of pixel units, each pixel unit comprising a pixel electrode, a common electrode and a source-drain channel, from the center of the display substrate to the edge of the display substrate, the plurality of sub display substrates are arranged from large to small according to the overlapping area of the pixel electrode and the common electrode, and/or the plurality of sub display substrates are arranged from small to large according to the width to length ratio of the source-drain channel of the sub display substrate.

The above are only for explanations rather than limitations of the present disclosure, the ordinary skilled person in the related technical field, in the case of not departing from the spirit and scope of the present disclosure, may also make various modifications and variations, therefore, all the equivalent technical solutions also belong to the category of the present disclosure, the patent protection scope of the present disclosure should be defined by the claims.

The invention claimed is:

1. A display substrate, comprising a plurality of sub display substrate, each of the sub display substrate comprising a plurality of pixel units, each pixel unit comprising a pixel electrode, a common electrode and a source-drain channel, wherein from the center of the display substrate to the edge of the display substrate, the plurality of sub display substrates are arranged from large to small according to overlapping area of the pixel electrode and the common electrode,
and/or the plurality of sub display substrates are arranged from small to large according to width to length ratio of the source-drain channel of the sub display substrate.

2. The display substrate according to claim 1, wherein as for each of the sub display substrates, a plurality of pixel units therein have the same structure.

3. The display substrate according to claim 1, wherein the plurality of sub display substrates are arranged in a matrix.

* * * * *